United States Patent [19]
Connolly et al.

[11] Patent Number: 5,619,523
[45] Date of Patent: Apr. 8, 1997

[54] SEMICONDUCTOR DISTRIBUTED FEEDBACK LASER DIODE

[75] Inventors: John C. Connolly, Clarksburg; Joseph H. Abeles, Highland Park, both of N.J.; Nancy A. Morris, Newtown, Pa.

[73] Assignee: David Sarnoff Research Center, Inc., Princeton, N.J.

[21] Appl. No.: 524,956

[22] Filed: Sep. 8, 1995

[51] Int. Cl.$^6$ ................................................. H01S 3/18
[52] U.S. Cl. ............................... 372/96; 372/46; 372/102
[58] Field of Search ..................................... 372/45, 46, 96, 372/102

[56] References Cited

U.S. PATENT DOCUMENTS 5,170,405  12/1992  Connolly et al. ........................ 372/48
5,295,150   3/1994  Vangieson et al. ...................... 372/96

OTHER PUBLICATIONS

A. Takemoto et al., "1.3–um Distributed Feedback Laser Diode with a Grating Accurately Controlled by a New Fabrication Technique", Journal of Lightwave Technology, vol. 1, No.1 12, Dec., 1989, pp. 2072–2076.

P. York et al., "MOCVD Regrowth over GaAS/AlGaAs Grating for High Power Long–Lived InGaAs/AlGaAs Lasers", Sixth International Conference on Metalorganic Vapor Phase Epitaxy, Cambridge, MA, 1992 (no month available).

*Primary Examiner*—Rodney B. Bovernick
*Assistant Examiner*—Yisun Song
*Attorney, Agent, or Firm*—William J. Burke

[57] ABSTRACT

A distributed-feed back semiconductor laser diode comprises a substrate of n-type conductivity GaAs having a pair of opposed surfaces, a pair of sides and a pair of ends. In sequence on one of the opposed surfaces are a first clad layer of n-type conductivity graded AlGaAs; a first confining layer of undoped AlGaAs; a first quantum well layer of undoped GaAs; a barrier layer of undoped AlGaAs; a second quantum well layer of undoped GaAs; a second confining layer of undoped AlGaAs; a spacer layer of p-type conductivity graded AlGaAs; a plurality of spaced, parallel grating bars of p-type conductivity AlGaAs extending across the spacer layer parallel to the ends of the substrate; a second clad layer of p-type conductivity graded AlGaAs over and between the grating bars; and contact layer of p+ type conductivity GaAs. A first conductive contact layer contacts the contact layer and a second conductive contact layer is on the other opposed surface of the substrate. The dual quantum well layers of undoped GaAs provide a laser diode which emits visible radiation at a wavelength less than 880 nm.

13 Claims, 1 Drawing Sheet ent of the Air Force.

SEMICONDUCTOR DISTRIBUTED FEEDBACK LASER DIODE

The United States Government has rights in this invention under Contract No. F33657-91-C-0006 with the Department of the Air Force.

The invention is directed to a semiconductor distributed feedback (DFB) laser diode, and, more particularly, to a single-mode DFB laser diode which emits radiation at a wavelength <880 nanometers (nm) and in the range of 760 nm.

BACKGROUND OF THE INVENTION

The performance characteristics of AlGaAs/GaAs laser diodes containing distributed feedback are critical for application such as optical-information processing, interferometric measuring, holographic printing and optical gas sensing. Such a laser diode is shown and described in U.S. Pat. No. 5,170,405 issued Dec. 8, 1992, and U.S. Pat. No. 5,295,150 issued Mar. 15, 1994. The type of laser diode shown in these patents general emits visible light in the 800–880 nm range. The performance characteristics of this type of laser diode includes single-longitudinal mode operation, narrow linewidth, enhanced modal stability, and extended frequency tunability with the absence of hysteresis.

Visible emission in the wavelength of <780 nm is advantageous in applications, such as optical-interferometric measuring and holographic printing, for ease in alignment of optical components and for safety. In addition, DFB lasers in the 760±5 nm regime enable sensing of the $O_2$ absorption bands using laser absorption spectroscopy. One important safety-regulated gas sensing application is to detect explosive levels of oxygen by laser absorption spectrometry. These lasers can also be used to monitor oxygen levels in the human breath to ascertain human metabolism and for medical diagnostics. AlGaAs/GaAs lasers emitting at around 760 nm are the desired sources for these applications since they are compact, rugged, reliable and lightweight. Although various structures of laser diodes using AlGaAs in the active region of the laser have been developed which emit at 780 nm or below, the fabrication of visible 750–800 nm AlGaAs/GaAs DFB lasers poses a greater challenge than their 800–880 nm AlGaAs/GaAs DFB counterparts. This is because of the requirement for increased AlAs content in the separate-confinement heterostructure. The increased AlAs mole fraction, particularly in the grating region, entails increased complications due to the presence of native oxides at the surface during the growth over the grating of the subsequent layers.

SUMMARY OF THE INVENTION

A semiconductor laser diode includes a substrate of a semiconductor material of a first conductivity type having first and second opposed surfaces. A first clad layer of a semiconductor material of the first conductivity type is on the first surface of the substrate. A first confining layer of an undoped semiconductor material is on the first clad layer, and a first quantum well layer of undoped semiconductor material is on the first confining layer. A barrier layer of undoped semiconductor material is on the first quantum well layer. A second quantum well layer of undoped semiconductor material is on the barrier layer, and a second confining layer of undoped semiconductor material is on the second quantum well layer. A spacer layer of a semiconductor material of a second conductivity type opposite to that of the first conductivity type is on the second confining layer. A plurality of spaced, parallel grating bars of a semiconductor material of the second conductivity type are on and extend across the spacer layer. A second clad layer of a semiconductor material of the second conductivity type is on and between the grating bars. The first and second clad layers, the first and second confining layers, the barrier layer, the grating bars and the spacer layer are all of AlGaAs, and the quantum well layers are of substantially only GaAs.

DETAILED DESCRIPTION

Figure 1:
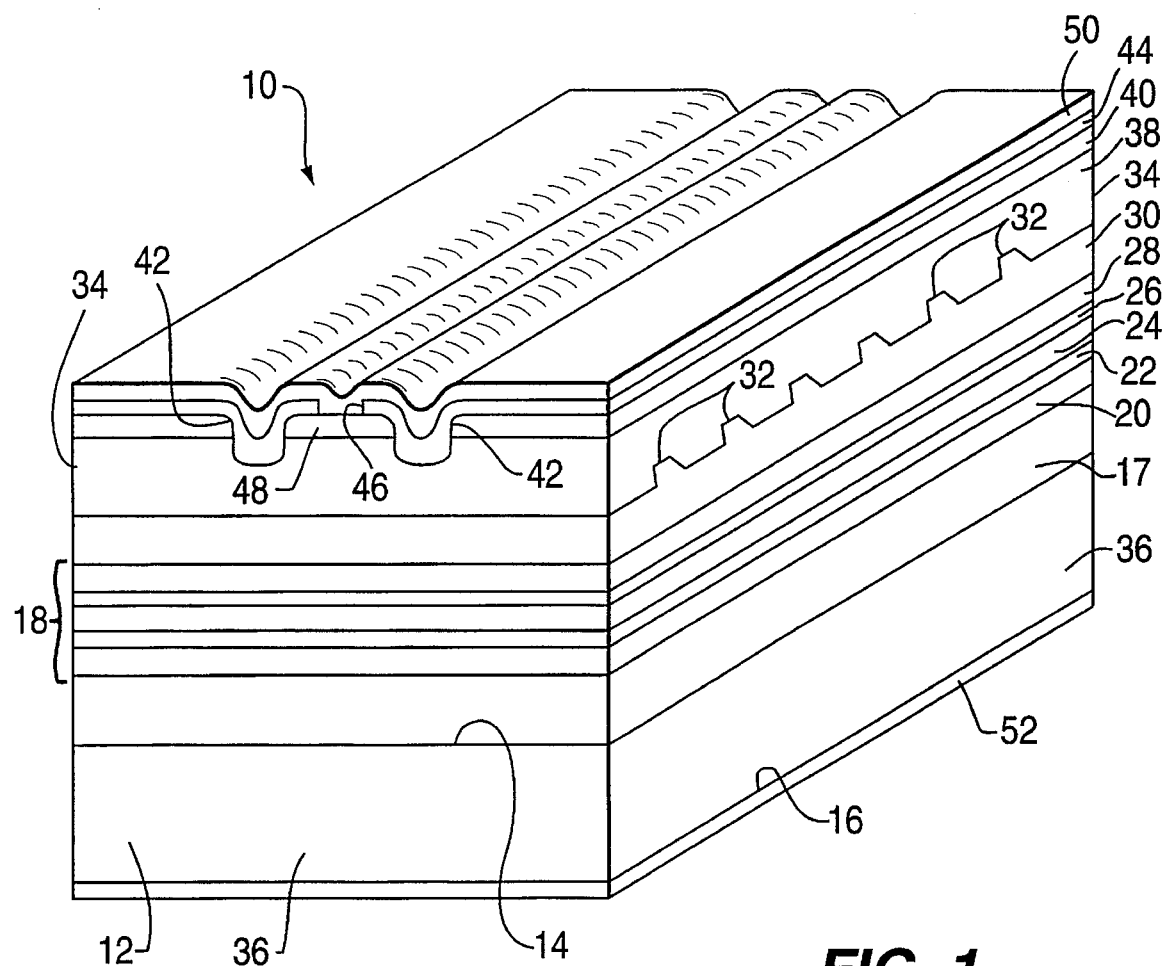
FIG. 1 is a perspective view of the laser diode in accordance with the invention.

In FIG. 1, the laser diode of the invention is generally designated as 10. Laser diode 10 comprises a substrate 12 of a semiconductor material of one conductivity type, preferably silicon doped, n+ type conductivity gallium arsenide (GaAs). The substrate 12 has first and second opposed surfaces 14 and 16. On the first surface 14 of the substrate 12 is a first clad layer 17 of n-type conductivity graded AlGaAs. The Al content of the first clad layer 17 is graded from a low amount at the first surface 14 of the substrate 12 to $Al_{0.60}Ga_{0.40}As$ at its surface away from the substrate 12. The first clad layer 17 is doped with either selenium, silicon or sulfur to a level of $0.2–2\times10^{18}$ impurities/cm$^3$, and is of a thickness of between 0.4 and 4 micrometers (μm) (preferably 1.2 μm).

Figure 2:
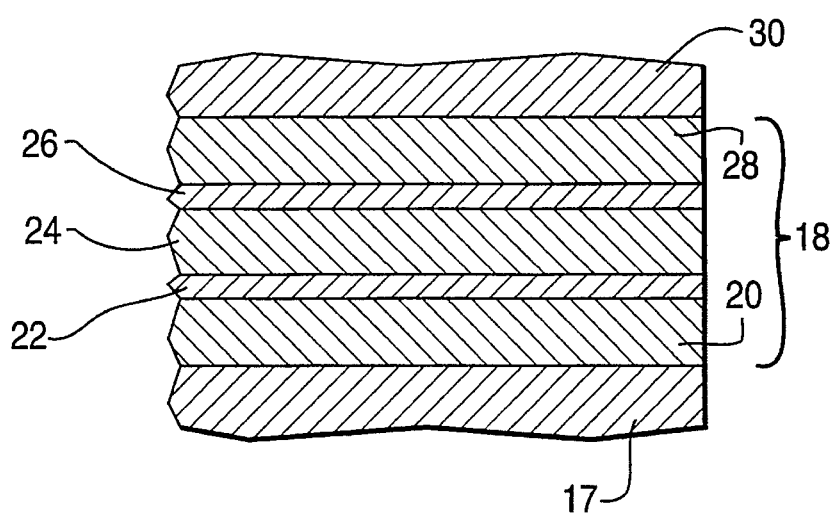
FIG. 2 is an enlarged sectional view of the active region of the laser diode of FIG. 1.

On the first clad layer 17 is a multi-quantum well region 18. As shown in FIG. 2, the multi-quantum well region 18 comprises a first confining layer 20 of undoped $Al_{0.60-0.20}Ga_{0.40-0.80}As$ of a thickness of between about 20 and 400 nanometers (nm) and preferably about 120 nm. Although the material of the first confining layer is not intentionally doped, it is inherently of n-type conductivity. On the first confining layer 20 is a first quantum well layer 22 of undoped GaAs of a thickness of about 2.8 nm. On the first quantum well layer 22 is a barrier layer 24 of $Al_{0.05-0.60}Ga_{0.40-0.95}As$ (preferably $Al_{0.25}Ga_{0.75}As$). The barrier layer 24 is of a thickness of between 5 nm and 100 nm and is preferably 40 nm in thickness. On the barrier layer is a second quantum well layer 26 of undoped GaAs of a thickness of about 2.8 nm. On the second quantum well layer 26 is a second confining layer 28 of undoped $Al_{0.20-0.60}Ga_{0.80-0.40}As$ of a thickness of between 20 nm and 4,000 nm (preferably 0.12 μm).

On the second confining layer 28 of the quantum well region 18 is a spacer layer 30 of p-type conductivity graded AlGaAs. The spacer layer 30 is of $Al_{0.40}Ga_{0.60}As$ at the second confining layer 28 and of $Al_{0.60}Ga_{0.40}As$ at its surface away from the second confining layer 28. The spacer layer 30 is doped with carbon at a doping level of between $1\times10^{16}$ to $5\times10^{19}$ impurities/cm$^3$ and preferably between $5\times10^{16}$ to $5\times10^{18}$ impurities/cm$^3$. The spacer layer 30 is of a thickness of between about 0.02 and 0.50 μm, and preferably about 0.10 μm.

On the spacer layer 30 are a plurality of spaced, parallel grating bars 32 which extend between the sides 34 of the diode 10 and parallel to the ends 36 of the diode 10. The grating bars 32 are of p-type conductivity $Al_{0.10-0.50}Ga_{0.90-0.50}As$ and are preferably $Al_{0.25}Ga_{0.75}As$. The grating bars 32 are of a thickness of between 20 nm and 300 nm and are preferably of a thickness of 0.12 μm. The grating bars 32 are of a width and spacing so as to provide a duty cycle of between 20% and 50% and preferably between 35% and 40%.

A p-type conductivity graded second clad layer 38 is over the grating bars 32 and extends into the spaces between the grating bars 32 to the spacer layer 30. Thus, the grating bars 32 are completely surrounded by the semiconductor material of the spacer layer 30 and the second clad layer 38. The second clad layer 38 is graded so as to be of $Al_{0.40}Ga_{0.60}As$ at the grating bars 32 and having a higher content of Al at its surface away from the grating bars 32. The second clad layer 38 is doped with either carbon, zinc or magnesium to a level of between $1\times10^{17}$ to $5\times10^{18}$ impurities/cm$^3$, and is of a thickness of between 0.3 μm and 3.0 μm and preferably 1.0 μm above the grating bars 32.

A p+ type conductivity cap layer 40 of GaAs is over the second clad layer 38. The cap layer 40 is doped to a level of between $5\times10^{17}$ to $5\times10^{20}$ impurities/cm$^3$, and preferably about $2-3\times10^{19}$ impurities/cm$^3$ and has a thickness of between 10 nm and 500 nm and preferably about 0.30 μm thick. A pair of spaced parallel grooves 42 are in the cap layer 40 and extend between the ends 36 of the diode 10 parallel to but spaced from the sides 34 of the diode 10. The grooves 42 are spaced apart between 1 and 10 μm and preferably about 4 μm. The grooves 42 are each of a width of about 10 μm, and extend into the second clad layer 38 a distance so as to achieve a single spatial mode.

A layer 44 of an insulating material, such as silicon dioxide ($SiO_2$) or silicon nitride, is over the cap layer 40 and the surface of the grooves 42. The layer 44 has an opening 46 therethrough over the portion 48 of the cap layer 40 which is between the grooves 42. A conductive contact layer 50 is over the insulating layer 44 and extends through the opening 46 to contact the surface of the cap layer 40. The contact layer 50 is of a material which makes good electrical contact to the material of the cap layer 40, and is preferably of Ti/Pt/Au tri-layer. A conductive contact layer 52 is on the surface 16 of the substrate 12. The contact layer 52 is of a material which makes good electrical contact to the material of the substrate 12, and is preferably a tri-layer of AuGe/Ni/Au. The ends 36 of the diode 10 are reflective with at least one of the ends 36 being partially transparent to allow radiation to be emitted therefrom.

To make the diode laser 10, the first clad layer 17 is epitaxially deposited on the surface 14 of the substrate 12. This is followed by epitaxially depositing in sequence the first confining layer 20, the first quantum well layer 22, the barrier layer 24, the second quantum well layer 26, the second confining layer 28, the spacer layer 30, and the grating layer 32. Each of these layers are deposited by the well known method of low-pressure metal organic chemical vapor deposition (MOCVD) in a vertical reactor using high speed rotation. The source materials can be trimethylaluminum (TMA), trimethylgallium (TMG), and arsine ($AsH_3$). Hydrogen selenide ($H_2Se$) and carbon tetrachloride ($CCl_4$) can be used to provide the n-type dopant selenium and the p-type dopant carbon.

The grating layer is then etched to form the grating bars 32. This is achieved by providing a masking layer over the grating layer and defining the masking layer using holographic exposure so that the masking layer covers only the portions of the grating layer to form the grating bars 32. The exposed portions of the grating layer are then etched away using a chemically assisted ion beam etching (CAIBE) or other suitable etching technique. The grating layer is etched completely therethrough and the etching is carried out into the underlying spacer layer 30. This controls the dimensions of the grating bars 32. The greater the etching into the spacer layer 30, the narrower the grating bars 32.

After the grating bars 32 are formed, the second clad layer 38 and the cap layer 40 are deposited in sequence using MOCVD. The second layer 38 is deposited between the grating bars 32 and into the cavities formed in the spacer layer 30. Since both the spacer layer 30 and the second clad layer 38 are of the same composition around the grating bars 30, the integrity of the grating bars 30 is maintained.

The two step deposition process described above creates several fundamental fabrication problems. The four major problems are: 1) material damage and/or contamination resulting from the etching steps in the grating bar fabrication; 2) oxidation of the AlGaAs/GaAs grating surface prior to the deposition of the covering layers; 3) introduction of additional contamination during the regrowth preparation and 4) preservation of the grating during pre-growth preparation and the regrowth process. To overcome these problems, the following steps are carried out after the grating bars 32 are etched but before the second clad layer 34 is deposited thereon.

First, the wafer is rinsed in a heated surfactant. The surfactant, which is a soap-like agent designed to enhance wetting of the surface, helps to remove particulate and loose other residue.

Second, the wafer is soaked in heated organic solvents. This removes photoresist residue and other processing residue.

Thirdly, the wafer is exposed to a wet chemical etch designed to remove semiconductor oxides and a small amount of the semiconductor material (about 5 nm). Removal of the oxides is very beneficial since the oxide tends to "getter" some of the processing residue owing to the reactivity of oxygen. The etching of the oxide helps to carry away surface contamination. Furthermore, wet chemical etches can be used which etch both the oxide as well as some of the underlying material where a majority of the damage occurs from grating fabrication and where photoresist is embedded. However, the wet etching procedure should be optimized to remove the oxide and grating fabrication damage while minimizing any reduction of the grating bar height.

Fourthly, the wafer is immediately loaded into the hydrogen ambient of the epitaxial growth system and is annealed for about 15 minutes at a temperature of 810° C. under an arsine overpressure prior to regrowth. Annealing allows atoms which have been knocked out of their lattice sites by the energetic ion beam to realign. This repairs some of the defects caused by ion beam milling and helps to prevent the formation of other defects resulting from poor nucleation on these defective lattice sites during regrowth.

After the cap layer 40 is deposited, the grooves 42 are formed in the layer 40 and into the second clad layer 34. This is achieved by providing a masking layer on the layer 40 and defining the masking layer so that it covers all of the layer 40 except where the grooves 42 are to be formed. The grooves 42 are then formed by any well known etching technique. After the grooves 42 are formed, the masking layer is removed. A layer of $SiO_2$ is then coated over the cap layer 40 including the grooves using any well known chemical vapor deposition technique. The opening 46 is then formed in the silicon oxide layer 44 using masking and etching techniques. The contact layers 50 and 52 are then coated over the $SiO_2$ layer 44 and the substrate surface 16 respectively. This can be achieved by depositing the various metals of the respective contact layer in sequence using either vacuum evaporation or sputtering techniques.

In the diode 10, the double GaAs quantum wells provide a laser which emits visible radiation at wavelengths <880 nm. The laser diode is a graded-index separate-confinement heterostructure multi-quantum-well ridge waveguide laser having good operating characteristics. A diode 10 made in the manner described above and having two 2.8 nm thick GaAs quantum well was found to emit visible radiation at 761 nm with good reliability. At room temperature, such a diode 10 having a 500 µm cavity length with 10% and 90% reflectivity facets coatings had a threshold current of 25 mA and, differential quantum efficiency of 35%. The device was single-mode over 4 nm wavelength with a side-mode-suppression ratio of more than 39 dB. The wavelength current-tuning rate was 0.0075 nm/mA or −3.5 GHz/mA. The spectral linewidth for the device is less than 3 MHz for an output power of 15 mW. The relative intensity noise taken in a 1 Hz bandwidth centered at 500 Mhz was less than 10 dB above the shot noise for detected power levels >1 mW.

Thus there is provided by the invention a single-mode distributed-feedback quantum well laser which emits visible radiation at a wavelength <880 nm and which has good operating characteristics. There is also provided by the invention a method of making such a laser diode. Although the diode 10 has been described with the quantum well layers 22 and 26 being entirely of GaAs, a small amount (1–10%) of either Al or In may be included in the quantum well regions. Although the addition of small amounts of Al or In may change the wavelength of the emitted radiation slightly, they provide other good effects. For example, the addition of In to the quantum wells improves reliability by decreasing movement of dark line defects. Also, although the first clad layer 17 is shown as being directly on the first surface 14 of the substrate 12, a buffer layer of GaAs or AlGaAs may be provided between the substrate surface 14 and the first clad layer 17. In addition, although various dopants have been disclosed for use in the various n-type and p-type layers, any other suitable dopant can be used.

We claim:

1. A semiconductor laser diode comprising:

a substrate of a semiconductor material of a first conductivity type having first and second opposed surfaces;

a first clad layer of a semiconductor material of the first conductivity type on the first surface of the substrate;

a confining layer of an undoped semiconductor material on the first clad layer;

a first quantum well layer of undoped semiconductor material on the first confining layer;

a barrier layer of undoped semiconductor material on the first quantum well layer;

a second quantum well layer of an undoped semiconductor material on the barrier layer;

a second confining layer of an undoped semiconductor material on the second quantum well layer;

a spacer layer of a semiconductor material of a second conductivity type opposite that of the first conductivity type on the second confining layer;

a plurality of spaced, parallel grating bars of a semiconductor material of said second conductivity type on and extending across the spacer layer;

a second clad layer of a semiconductor material of said second conductivity type on and between the grating bars;

a cap layer of highly a highly conductive semiconductor material of the second conductivity type on the second clad layer;

a first conductive contact on the cap layer; and a second conductive contact on the second surface of the substrate;

the first and second clad layers, first and second confining layers, barrier layer, spacer layer and grating bars being of AlGaAs, and the quantum well layers and the cap layer each being substantially of GaAs;

each of the clad layers being of graded AlGaAs with the first clad layer having a lower content of aluminum at the surface of the substrate than at the first confining layer and the second clad layer having a higher content of aluminum at the cap layer than at the spacer layer.

2. The semiconductor laser diode in accordance with claim 1 in which the cap layer has a pair of spaced, parallel grooves therein extending substantially perpendicular to the grating bars, and the first conductive contact engages the cap layer in the portion of the cap layer between the grooves.

3. The semiconductor laser diode in accordance with claim 2 in which the grooves extend through the cap layer and into the second clad layer.

4. The semiconductor laser diode in accordance with claim 3 further comprising a layer of an insulating material on the cap layer and the grooves, an opening in the insulating layer over the portion of the cap layer between the grooves, and the first conductive contact is over the insulating layer and extends through the opening in the insulating layer to engage the cap layer.

5. The semiconductor laser diode in accordance with claim 4 in which the laser has a pair of parallel sides and a pair of parallel ends, the grating bars extend substantially parallel to the ends and between the sides, and the grooves in the cap layer extend substantially parallel to the sides and between the ends.

6. The semiconductor laser diode in accordance with claim 1 in which the quantum well layers are each entirely of GaAs containing 0 to 10% of either aluminum or indium or both.

7. The semiconductor laser diode in accordance with claim 1 in which the spacer layer is of graded AlGaAs with the content of aluminum being lower at the grating bars than at the second confining layer.

8. The semiconductor laser diode in accordance with claim 7 in which the spacer layer is of $Al_{0.60}Ga_{0.40}As$ at the second confining layer and is of $Al_{0.40}Ga_{0.60}As$ at the grating bars.

9. The semiconductor laser diode in accordance with claim 8 wherein:

the first confining layer is of $Al_{0.60-0.20}Ga_{0.40-0.80}As$, the second confining layer is of $Al_{0.20-0.60}Ga_{0.80-0.40}As$, and the grating bars are of $Al_{0.25}Ga_{0.75}As$; and each of the clad layers if of a thickness of between 0.4 and 4.0 micrometers, each of the confining layers is of a thickness of between 30 nanometers and 400 nanometers, each of the quantum well layers is of a thickness of about 2.8 nm, the barrier layer is of a thickness of about 40 nanometers, the spacer layer is of a thickness of between 20 nanometers and 0.5 micrometers, each of the grating bars is of a thickness of between 20 nanometers and 300 nanometers, and the contact layer is of a thickness of between 10 nanometers and 500 nanometers.

10. A semiconductor laser diode comprising:

a substrate of n+ type conductivity GaAs having first and second opposed surfaces, a pair of parallel sides and a pair of parallel ends;

a first clad layer of n-type conductivity AlGaAs on the first substrate surface, said first clad layer being of graded GaAlAs and being of $Al_{0.60}Ga_{0.40}As$ at its surface away from the substrate and being of a thickness of about 1.2 micrometers;

a first confining layer of undoped $Al_{0.60-0.20}Ga_{0.40-0.80}As$ on the first clad layer, said first confining layer being about 0.12 micrometers in thickness;

a first quantum well layer of undoped GaAs on the first confining layer, said first quantum well layer being of a thickness of about 2.8 nm;

a barrier layer of undoped $Al_{0.25}Ga_{0.75}As$ on the first quantum well layer, said barrier layer being of a thickness of about 40 nm;

a second quantum well layer of undoped GaAs on the barrier layer, said second quantum well layer being of a thickness of about 2.8 nm;

a second confining layer of undoped $Al_{0.20-0.60}Ga_{0.80-0.40}As$ on the second quantum well layer, said second confining layer being of a thickness of about 0.12 micrometers;

a spacer layer of p-type conductivity graded $Al_{0.60-0.40}Ga_{0.40-0.60}As$ on the second confining layer, said spacer layer being of a thickness of about 0.10 micrometers;

a plurality of spaced, parallel grating bars on the spacer layer extending parallel to the ends of the substrate and between the sides, said grating bars being of p-type conductivity $Al_{0.25}Ga_{0.75}As$ and of a thickness of about 0.12 micrometers;

a second clad layer of p-type conductivity AlGaAs over and between the grating bars and contacting the spacer layer, said second clad layer being of $Al_{0.40}Ga_{0.60}As$ at the spacer layer and grating bars and being graded to a higher content of Al at its other surface and being of a thickness of about 1.0 micrometers;

a cap layer of p+ type conductivity GaAs on the second clad layer, said cap layer being of a thickness of about 0.30 micrometers;

a first conductive contact layer on the cap layer; and a second conductive contact layer on the second surface of the substrate.

11. A semiconductor laser diode in accordance with claim 10 in which the cap layer has a pair of spaced, parallel grooves therein extending parallel to the sides of the substrate and between the ends, and the first conductive contact layer engages the cap layer in the portion of the cap layer between the grooves.

12. A semiconductor laser diode in accordance with claim 11 further comprising a layer of an insulating material on the cap layer and the grooves, an opening in the insulating layer over the portion of the contact layer between the grooves, and the first conductive contact layer is over the insulating layer and extends through the opening in the insulating layer to engage the cap layer.

13. A semiconductor laser diode in accordance with claim 12 in which the grooves in the cap layer extend through the cap layer and into the second clad layer.

* * * * *